(12) United States Patent
Lin et al.

(10) Patent No.: US 10,749,143 B2
(45) Date of Patent: Aug. 18, 2020

(54) ORGANIC LIGHT EMITTING DIODE PANEL (71) Applicant: Wuhan China Star Optoelectronics Semiconductor Display Technology Co., Ltd., Wuhan, Hubei (CN)

(72) Inventors: Jianhong Lin, Hubei (CN); Di Zhang, Hubei (CN)

(73) Assignee: WUHAN CHINA STAR OPTOELECTRONICS SEMICONDUCTOR DISPLAY TECHNOLOGY CO., LTD., Wuhan, Hubei (CN)

( * ) Notice: Subject to any disclaimer, the term of this patent is extended or adjusted under 35 U.S.C. 154(b) by 115 days.

(21) Appl. No.: 16/090,968

(22) PCT Filed: Sep. 13, 2018

(86) PCT No.: PCT/CN2018/105587
§ 371 (c)(1),
(2) Date: Oct. 3, 2018

(87) PCT Pub. No.: WO2019/196336
PCT Pub. Date: Oct. 17, 2019

(65) Prior Publication Data
US 2020/0168843 A1 May 28, 2020

(30) Foreign Application Priority Data
Apr. 11, 2018 (CN) .......................... 2018 1 0321519

(51) Int. Cl.
*H01L 51/52* (2006.01)
*H01L 27/32* (2006.01)

(52) U.S. Cl.
CPC ........ *H01L 51/5278* (2013.01); *H01L 27/326* (2013.01); *H01L 51/5253* (2013.01)

(58) Field of Classification Search
CPC ............. H01L 51/5278; H01L 51/5253; H01L 27/326
See application file for complete search history.

(56) References Cited

U.S. PATENT DOCUMENTS

2014/0353597 A1* 12/2014 Ahn .................... H01L 51/5265
257/40

FOREIGN PATENT DOCUMENTS

| CN | 102705790 A | 10/2013 |
| CN | 105895664 A | 8/2016 |

(Continued)

*Primary Examiner* — Selim U Ahmed
(74) *Attorney, Agent, or Firm* — Leong C. Lei (57) ABSTRACT

Provided is an organic light emitting diode panel. The organic light emitting diode panel includes a thin film transistor substrate, a first anode layer disposed on the thin film transistor substrate and a second anode layer and a pixel definition layer disposed on the first anode layer, wherein the pixel definition layer comprises a first pixel definition layer disposed between the first anode layer and the second anode layer. By disposing the first anode layer and the second anode layer, as the organic light emitting diode panel displays, the reflection of the light emitted from the organic light emitting diode functional layer inside the organic light emitting diode panel is greatly enhanced, to enhance the brightness and viewing angle of the organic light emitting diode panel, to reduce the power consumption, and to improve the product quality.

8 Claims, 4 Drawing Sheets

(56) References Cited

FOREIGN PATENT DOCUMENTS

CN          107611280 A     1/2018
CN          108400154 A     8/2018

\* cited by examiner

ORGANIC LIGHT EMITTING DIODE PANEL

RELATED APPLICATIONS

The present application is a National Phase of International Application Number PCT/CN2018/105587, filed Sep. 13, 2018, and claims the priority of China Application No. 201810321519.8, filed Apr. 11, 2018.

FIELD OF THE INVENTION

The present invention relates to a display field, and more particularly to an organic light emitting diode panel.

BACKGROUND OF THE INVENTION

The Organic Light Emitting Display (OLED) device possesses many outstanding properties of self-illumination, low driving voltage, high luminescence efficiency, short response time, high clarity and contrast, near 180 degrees view angle, wide range of working temperature, applicability of flexible display and large scale full color display. The OLED is considered as the most potential display device.

The OLED can be categorized into two major types according to the driving ways, which are the Passive Matrix OLED (PMOLED) and the Active Matrix OLED (AMOLED), i.e. two types of the direct addressing and the Thin Film Transistor matrix addressing. The AMOLED comprises pixels arranged in array and belongs to active display type, which has high lighting efficiency and is generally utilized for the large scale display devices of high resolution.

The OLED element generally comprises a substrate, an anode located on the substrate, a Hole Injection Layer located on the anode, a Hole Transporting Layer located on the Hole Injection Layer, an emitting layer located on the Hole Transporting Layer, an Electron Transport Layer located on the emitting layer, an Electron Injection Layer located on the Electron Transport Layer and a Cathode located on the Electron Injection Layer. The principle of the OLED element is that the illumination generates due to the carrier injection and recombination under the electric field driving of the semiconductor material and the organic semiconductor illuminating material. Specifically, the Indium Tin Oxide (ITO) electrode and the metal electrode are respectively employed as the anode and the cathode of the Display. Under certain voltage driving, the Electron and the Hole are respectively injected into the Electron and Hole Transporting Layers from the cathode and the anode. The Electron and the Hole respectively migrate from the Electron and Hole Transporting Layers to the Emitting layer and bump into each other in the Emitting layer to form an exciton to excite the emitting molecule. The latter can illuminate after the radiative relaxation.

With the development of display technologies, people are pursuing larger screens, higher resolutions, and more stimulating visual effects. This poses higher requirements for the manufacturing process, materials, and processes of the panels. The large-sized OLED displays possessing better visual experience have become a major trend in the future. However, the larger the size of the OLED display is, the higher the power consumption of the display becomes, which affects the quality of the product.

SUMMARY OF THE INVENTION

An objective of the present invention is to provide an organic light emitting diode panel, which possesses high luminous efficiency, low power consumption, and good product quality.

For realizing the aforesaid objective, the present invention first provides an organic light emitting diode panel, comprising a thin film transistor substrate, a first anode layer disposed on the thin film transistor substrate and a second anode layer and a pixel definition layer disposed on the first anode layer, wherein the pixel definition layer comprises a first pixel definition layer disposed between the first anode layer and the second anode layer.

The pixel definition layer further comprises a second pixel definition layer disposed on the second anode layer.

The first pixel definition layer and the second pixel definition layer have the same material.

The first anode layer comprises a plurality of first anodes; the second anode layer comprises a plurality of second anodes; a first space is formed between two adjacent first anodes, and the second anode is correspondingly disposed above the first space.

A width of the second anode is greater than a width of the first space.

A plurality of first openings is disposed on the plurality of first anodes, and a plurality of second openings is disposed on the plurality of second anodes, and an organic light emitting diode functional layer is provided in the first opening and in the second opening.

The organic light emitting diode panel further comprises a planarization layer disposed between the first anode layer and the thin film transistor substrate, and the first anode and the second anode are electrically connected to the thin film transistor substrate by penetrating through the planarization layer.

The organic light emitting diode panel further comprises a third anode layer disposed on the second pixel definition layer.

The pixel definition layer further comprises a third pixel definition layer disposed on the third anode layer;

the first pixel definition layer, the second pixel definition layer and the third pixel definition layer have the same material.

The third anode layer comprises a plurality of third anodes; the third anode is correspondingly disposed above the first space, and both a width of the second anode and a width of the third anode are less than a width of the first space; and a sum of the width of the second anode and the width of the third anode is greater than the width of the first space;

a plurality of third openings is disposed on the plurality of third anodes, and the organic light emitting diode functional layer is provided in the third opening.

The benefits of the present invention are: the present invention provides an organic light emitting diode panel, comprising a thin film transistor substrate, a first anode layer disposed on the thin film transistor substrate and a second anode layer and a pixel definition layer disposed on the first anode layer, wherein the pixel definition layer comprises a first pixel definition layer disposed between the first anode layer and the second anode layer. By disposing the first anode layer and the second anode layer, as the organic light emitting diode panel displays, the reflection of the light emitted from the organic light emitting diode functional layer inside the organic light emitting diode panel is greatly enhanced, to enhance the brightness and viewing angle of the organic light emitting diode panel, to reduce the power consumption, and to improve the product quality.

BRIEF DESCRIPTION OF THE DRAWINGS

In order to better understand the characteristics and technical aspect of the invention, please refer to the following detailed description and accompanying drawings of the present invention. However, the drawings are provided for reference only and are not intended to be limiting of the invention.

In drawings.

DETAILED DESCRIPTION OF PREFERRED EMBODIMENTS

For better explaining the technical solution and the effect of the present invention, the present invention will be further described in detail with the accompanying drawings and the specific embodiments.

The present invention provides an organic light emitting diode panel. Please refer to FIG. 1, which is a diagram of the first embodiment of an organic light emitting diode panel according to the present invention. The first embodiment of the organic light emitting diode panel according to the present invention comprises a thin film transistor substrate 100, a first anode layer 210 disposed on the thin film transistor substrate 100, and a second anode layer 220 and a pixel definition layer 300 disposed on the first anode layer 210. The pixel definition layer 300 comprises a first pixel definition layer 310 disposed between the first anode layer 210 and the second anode layer 220 and a second pixel definition layer 320 disposed on the second anode layer 220.

Specifically, a material of the first pixel definition layer 310 and a material of the second pixel definition layer 320 can be selected from any one of polyimide (PI) and silicon nitride (SiN). The material of the first pixel definition layer 310 and the material of the second pixel definition layer 320 may be the same or different. Preferably, in the first embodiment of the present invention, the first pixel definition layer 310 and the second pixel definition layer 320 have the same material. Please refer to FIG. 1. There is no clear boundary between the first pixel definition layer 310 and the second pixel definition layer 320.

Figure 1:
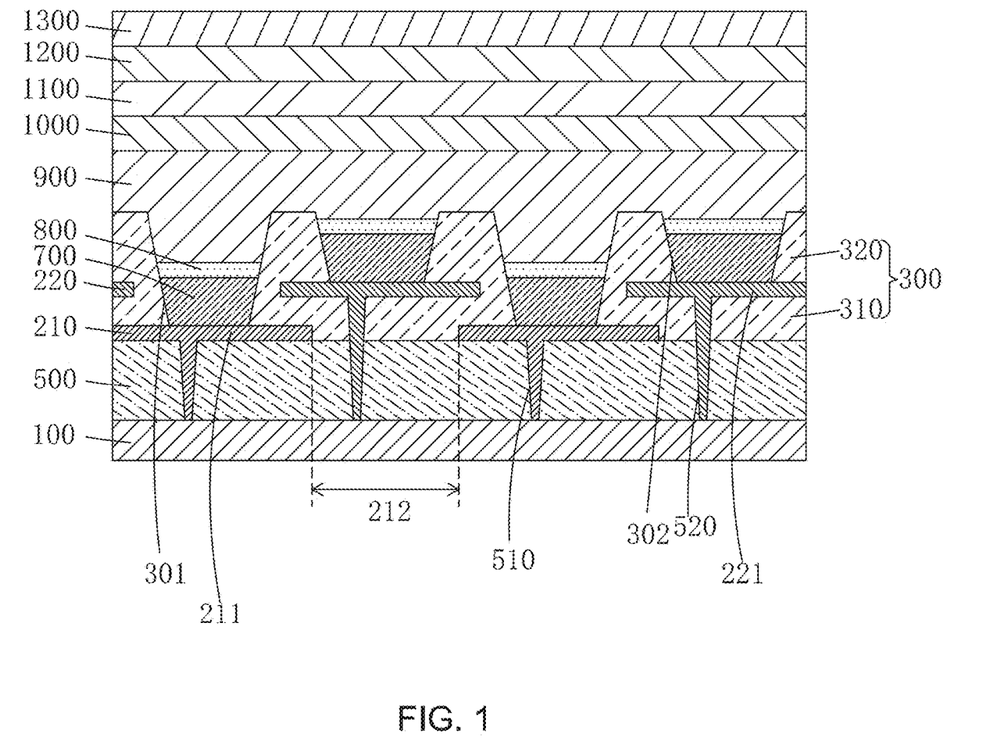
FIG. 1 is a cross-sectional view diagram of the first embodiment of an organic light emitting diode panel according to the present invention.

Specifically, the first anode layer 210 and the second anode layer 220 can be made of any material with high reflectivity. Preferably, the first anode layer 210 and the second anode layer 220 each include two indium tin oxide (ITO) layers and a silver (Ag) layer disposed between the two indium tin oxide layers.

Figure 2:
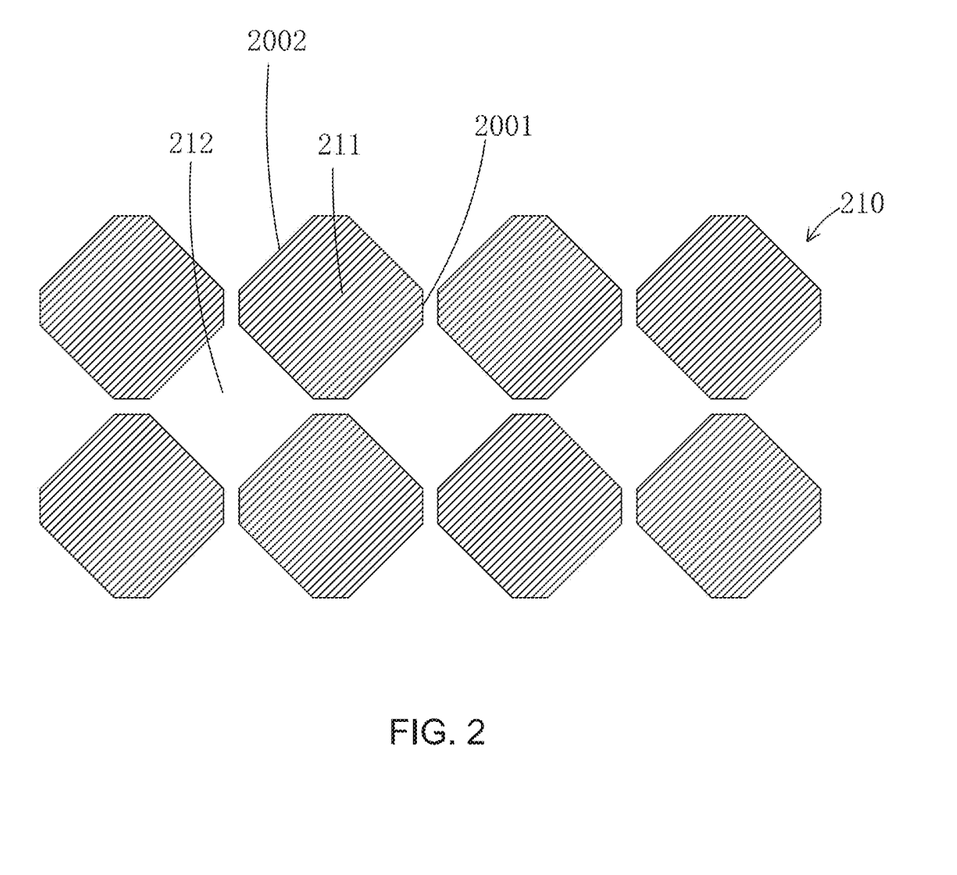
FIG. 2 is a top view diagram of a first anode layer in the first embodiment of the organic light emitting diode panel of the present invention.
Figure 3:
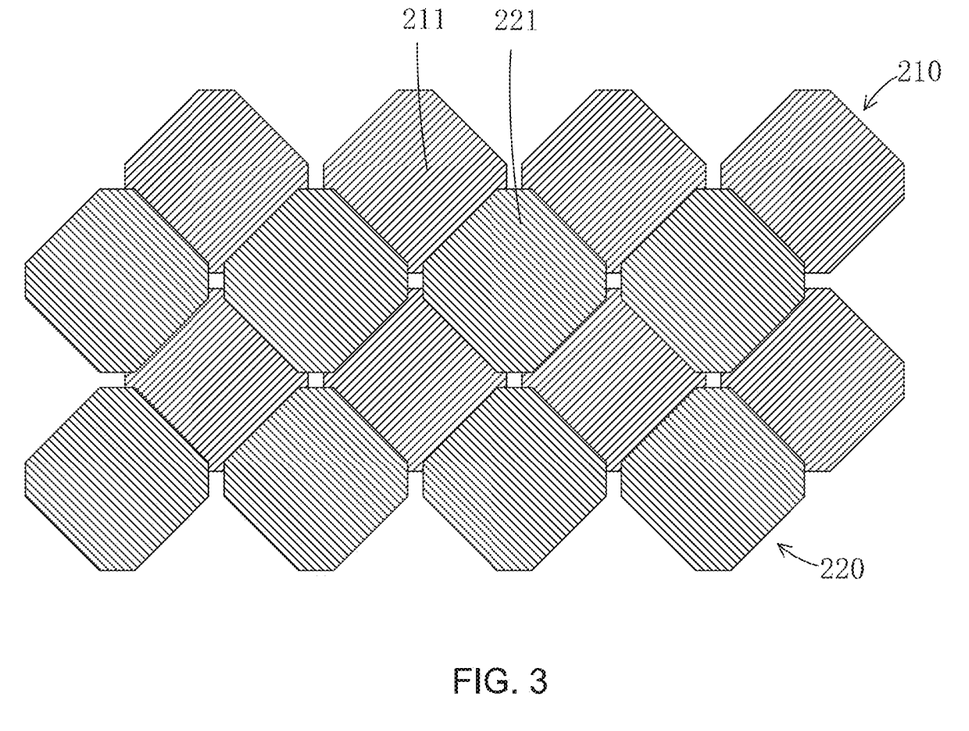
FIG. 3 is a top view diagram of the first anode layer and a second anode layer in the first embodiment of the organic light emitting diode panel of the present invention.

Specifically, referring to FIG. 1 in combination with FIGS. 2 and 3, in the first embodiment of the present invention, the first anode layer 210 comprises a plurality of first anodes 211. The second anode layer 220 comprises a plurality of second anodes 221. A first space 212 is formed between two adjacent first anodes 211, and the second anode 221 is correspondingly disposed above the first space 212. A width of the second anode 221 is greater than a width of the first space 212. Thus, a projection of the second anode 221 on the thin film transistor substrate 100 and a projection of the first anode 211 on the thin film transistor substrate 100 can cover the thin film transistor substrate 100 as much as possible, so that the first anode layer 210 and the second anode layer 220 together form a compact reflective structure. After the organic light emitting diode functional layer is formed on the first anode layer 210 and the second anode layer 220, light emitted from the organic light emitting diode functional layer can be reflected as much as possible by the first anode layer 210 and the second anode layer 220 and can be emitted to the direction away from the thin film transistor substrate 100 to enhance the lighting brightness.

Furthermore, referring to FIG. 2 and FIG. 3, in the first embodiment of the present invention, the plurality of first anodes 211 is arranged in an array, and the plurality of second anodes 221 is also in an array. Each first anode 211 and each second anode 221 comprise four equal-length first sides 2001 and four equal-length second sides 2002. The four first sides 2001 and the four second sides 2002 are alternately arranged in a closed pattern. The first side 2001 and the second side 2002 are straight lines, and the length of the first side 2001 is less than the length of the second side 2002. Please refer to FIG. 2. The adjacent second sides 2002 of the adjacent four first anodes 211 form a first space 212. Please refer to FIG. 3. Each second anode 221 is correspondingly disposed above one first space 212.

Specifically, referring to FIG. 1, in the first embodiment of the present invention, a plurality of first openings 301 is disposed on the plurality of first anodes 211, and a plurality of second openings 302 is disposed on the plurality of second anodes 221, and an organic light emitting diode functional layer 700 is provided in the first opening 301 and in the second opening 302.

Specifically, in the first embodiment of the present invention, the thin film transistor substrate 100 has a plurality of thin film transistor elements (not shown) corresponding to the plurality of first anodes 211 and the plurality of second anodes 221, respectively. The thin film transistor elements have drains. The organic light emitting diode panel further comprises a planarization layer 500 disposed between the first anode layer 210 and the thin film transistor substrate 100. Please refer to FIG. 1, in the first embodiment of the present invention, a first via 510 exposing the drain of the thin film transistor element corresponding to the first anode 211 is provided in the planarization layer 500, The first anode 211 is electrically connected to the drain of the corresponding thin film transistor element on the thin film transistor substrate 100 through the first via 510, so that as the corresponding thin film transistor element is activated, a data voltage can be transmitted to the first anode 211 through the drain of the thin film transistor element, A second via 520 exposing the drain of the thin film transistor element corresponding to the second anode 221 is provided in the planarization layer 500 and the first pixel definition layer 310. The second anode 221 is electrically connected to the drain of the corresponding thin film transistor element on the thin film transistor substrate 100 through the second via 520, so that as the corresponding thin film transistor element is activated, a data voltage can be transmitted to the second anode 221 through the drain of the thin film transistor element, Specifically, the organic light emitting diode panel further comprises a cathode 800 disposed on the organic light emitting diode functional layer 700. In the first embodiment of the present invention, the first anode 211 and the second anode 221 respectively constitute an organic light emitting diode element together with the organic light emitting diode functional layer 700 and the cathode 800 thereabove.

Specifically, a material of the cathode 800 is a transparent material. Preferably, the material of the cathode 800 is indium tin oxide (ITO).

Specifically, in the first embodiment of the present invention, the organic light emitting diode panel further a thin film packaging layer 900 disposed on the cathode 800 and the second pixel definition layer 320 for preventing water and oxygen from invading the organic light emitting diode element, a touch layer 1000 disposed on the thin film packaging layer 900 for implementing a touch function, an optical adhesive layer 1100 disposed on the touch layer 1000, a polarizer 1200 disposed on the optical adhesive layer 1100 and a cover plate 1300 covering the polarizer 1200.

Furthermore, there are two methods for fabricating the first embodiment of the organic light emitting diode panel of the present invention.

The first manufacturing method of the first embodiment of the organic light emitting diode panel of the present invention specifically is: firstly, a thin film transistor substrate 100 is provided, and a planarization layer 500 is formed on the thin film transistor substrate 100. Afterwards, an electrode material is formed on the planarization layer 500 and is patterned to obtain a first anode layer 210. A first pixel definition layer 310 is formed on the planarization layer 500 and the first anode layer 210. Then, an electrode material is formed on the first pixel definition layer 310 and is patterned to obtain a second anode layer 220. Afterwards, a second pixel definition layer 320 is formed on the first pixel definition layer 310 and the second anode layer 220, and then a plurality of first openings 301, correspondingly disposed above the plurality of first anodes 211, is formed on the first pixel definition layer 310 and the second pixel definition layer 320, and a plurality of second openings 302, correspondingly disposed above the plurality of second anodes 221, is formed on the second pixel definition layer 320. Afterwards, an organic light emitting diode functional layer 700 is formed in the plurality of first openings 301 and the plurality of second openings 302, and a cathode 800 is formed on the organic light emitting diode functional layer 700. Finally, a thin film packaging layer 900 is formed on the cathode 800 and the second pixel defining layer 320. A touch layer 1000, an optical adhesive layer 1100, a polarizer 1200 and a cover plate 1300 are sequentially formed on the thin film packaging layer 900. The difference of the second manufacturing method of the first embodiment of the organic light emitting diode panel of the present invention from the first manufacturing method is that: after the first pixel definition layer 310 is formed, the plurality of the first openings 301, correspondingly disposed above the plurality of first anodes 211, is first formed on the first pixel definition layer 310. Then, after forming the second pixel definition layer 320, the plurality of second openings 302, correspondingly disposed above the plurality of second anodes 221, is formed on the second pixel definition layer 320. Meanwhile, a portion of the second pixel definition layer 320 corresponding to the first opening 301 is removed, and the rest steps are the same as those of the first manufacturing method. Compared with the first fabricating method, the second fabricating method does not need to make openings with different depths. The process is simple and the reliability is higher.

Specifically, in the first embodiment of the organic light emitting diode of the present invention, the first anode layer 210 is disposed above the thin film transistor substrate 100, and the second anode layer 220 and the pixel definition layer 300 are disposed on the first anode layer 210, and specifically, the width of the plurality of the second anode 221 of the second anode layer 220 is greater than the width of the first space 212 among the plurality of the first anode 211 of the first anode layer 210. Thus, the first anode layer 210 and the second anode layer 220 together shield the thin film transistor substrate 100 to form a compact reflective layer inside the organic light emitting diode panel. Thus, as the organic light emitting diode panel displays, the light emitted from the organic light emitting diode functional layer 700 is totally reflected on the compact reflective layer formed by the first anode layer 210 and the second anode layer 220, together. The reflection of the light emitted from the organic light emitting diode functional layer 700 inside the organic light emitting diode panel is greatly enhanced, to enhance the brightness and viewing angle of the organic light emitting diode panel, to reduce the power consumption, and to improve the product quality.

Figure 4:
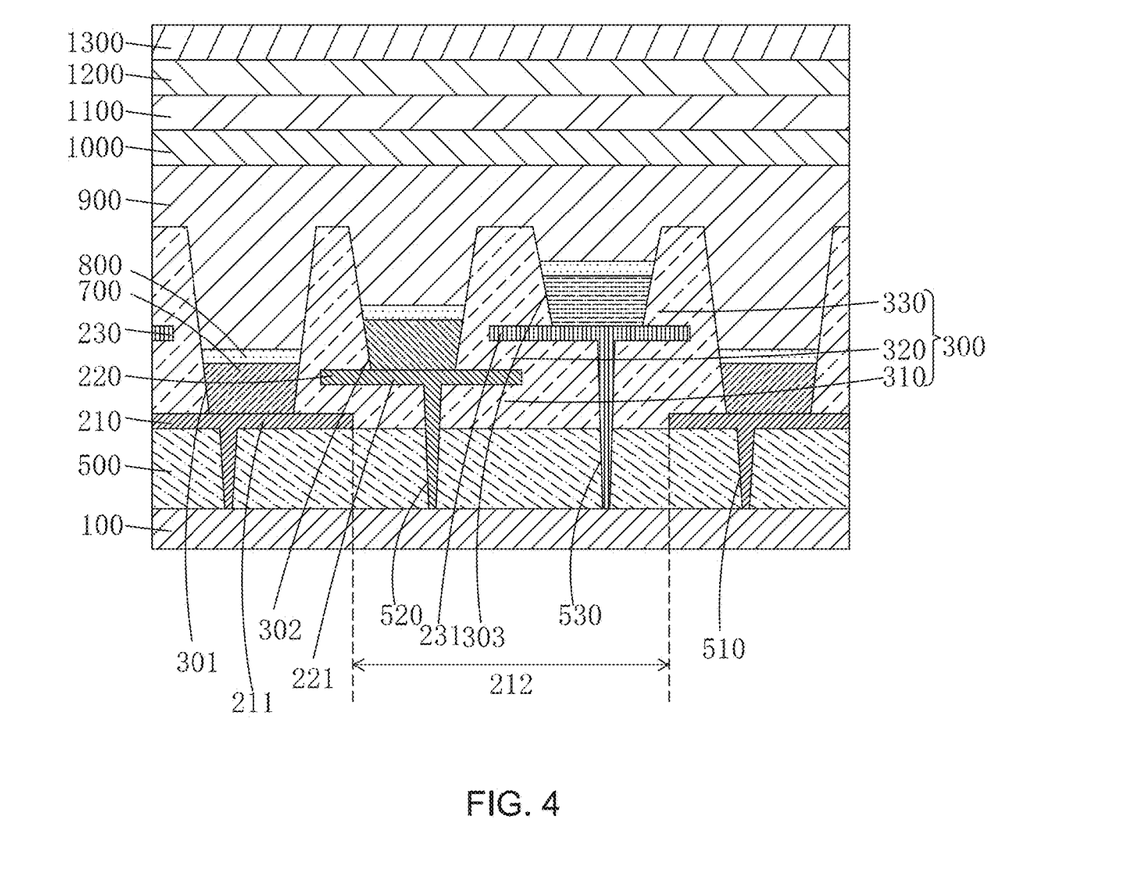
FIG. 4 is a cross-sectional view diagram of the second embodiment of an organic light emitting diode panel according to the present invention.

Please refer to FIG. 4, which is the second embodiment of an organic light emitting diode panel of the present invention. The difference of the second embodiment from the aforesaid first embodiment is that the organic light emitting diode panel further comprises a third anode layer 230 disposed on the second pixel definition layer 320. The pixel definition layer 300 further comprises a third pixel definition layer 330 disposed on the third anode layer 230.

Specifically, a material of the first pixel definition layer 310, a material of the second pixel definition layer 320 and a material of the third pixel definition layer 330 can be selected from any one of polyimide and silicon nitride. The material of the first pixel definition layer 310, the material of the second pixel definition layer 320 and the material of the third pixel definition layer 330 may be the same or different. Preferably, Preferably, in the second embodiment of the present invention, the first pixel definition layer 310, the second pixel definition layer 320 and the third pixel definition layer 330 have the same material. Please refer to FIG. 4. There is no clear boundary between the first pixel definition layer 310, the second pixel definition layer 320 and the third pixel definition layer 330.

Specifically, the third anode layer 230 can be made of any material with high reflectivity. Preferably, the third anode layer 230 also includes two indium tin oxide (ITO) layers and a silver (Ag) layer disposed between the two indium tin oxide layers.

Specifically, referring to FIG. 4, in the second embodiment of the present invention, the third anode layer 230 comprises a plurality of third anodes 231. The third anode 231 is correspondingly disposed above the first space 212. Both a width of the second anode 221 and a width of the third anode 231 are less than a width of the first space 212, and a sum of the width of the second anode 221 and the width of the third anode 231 is greater than the width of the first space 212. Thus, a projection of the second anode 221 on the thin film transistor substrate 100, a projection of the first anode 211 on the thin film transistor substrate 100 and a projection of the third anode 231 on the thin film transistor substrate 100 can cover the thin film transistor substrate 100 as much as possible, so that the first anode layer 210, the second anode layer 220 and the third anode layer 230 together form a compact reflective structure. After the organic light emitting diode functional layer is formed on the first anode layer 210, the second anode layer 220 and the third anode layer 230, light emitted from the organic light emitting diode functional layer can be reflected as much as possible by the first anode layer 210, the second anode layer 220 and the third anode layer 230 and can be emitted to the direction away from the thin film transistor substrate 100 to enhance the lighting brightness.

Specifically, referring to FIG. 4, in the second embodiment of the present invention, a plurality of first openings 301 is disposed on the plurality of first anodes 211, and a plurality of second openings 302 is disposed on the plurality of second anodes 221, and a plurality of third openings 303 is disposed on the plurality of third anodes 231. While, an organic light emitting diode functional layer 700 is disposed in the first opening 301 and the second opening 302, and an organic light emitting diode functional layer 700 is also disposed in the third opening 303.

Specifically, in the second embodiment of the present invention, the first anode 211, the second anode 221 and the third anode 231 respectively constitute an organic light emitting diode element together with the organic light emitting diode functional layer 700 and the cathode 800 thereabove.

Specifically, in the second embodiment of the present invention, the thin film transistor substrate 100 further comprises a plurality of thin film transistor elements corresponding to the plurality of third anodes 231, a third via 530 exposing the drain of the thin film transistor element corresponding to the third anode 231 is provided in the planarization layer 500, the first pixel definition layer 310 and the second pixel definition layer 320. The third anode 231 is electrically connected to the drain of the corresponding thin film transistor element on the thin film transistor substrate 100 through the third via 530, so that as the corresponding thin film transistor element is activated, a data voltage can be transmitted to the third anode 231 through the drain of the thin film transistor element.

Specifically, in the second embodiment of the present invention, the thin film packaging layer 900 is disposed on the cathode 800 and the third pixel definition layer 330.

Furthermore, there are two methods for fabricating the second embodiment of the organic light emitting diode panel of the present invention.

The first manufacturing method of the second embodiment of the organic light emitting diode panel of the present invention specifically is: firstly, a thin film transistor substrate 100 is provided, and a planarization layer 500 is formed on the thin film transistor substrate 100. Afterwards, an electrode material is formed on the planarization layer 500 and is patterned to obtain a first anode layer 210. A first pixel definition layer 310 is formed on the planarization layer 500 and the first anode layer 210. Then, an electrode material is formed on the first pixel definition layer 310 and is patterned to obtain a second anode layer 220. Afterwards, a second pixel definition layer 320 is formed on the first pixel definition layer 310 and the second anode layer 220. Afterwards, an electrode material is formed on the second pixel definition layer 320 and is patterned to obtain a third anode layer 230. A third pixel definition layer 330 is formed on the second pixel definition layer 320 and the third anode layer 230. Then, a plurality of first openings 301, correspondingly disposed above the plurality of first anodes 211, is formed on the first pixel definition layer 310, the second pixel definition layer 320 and the third pixel definition layer 330, and a plurality of second openings 302, correspondingly disposed above the plurality of second anodes 221, is formed on the second pixel definition layer 320 and the third pixel definition layer 330, and a plurality of third openings 303, correspondingly disposed above the plurality of third anodes 231, is formed on the third pixel definition layer 330. Afterwards, an organic light emitting diode functional layer 700 is formed in the plurality of first openings 301, the plurality of second openings 302 and the plurality of third openings 303, and a cathode 800 is formed on the organic light emitting diode functional layer 700. Finally, a thin film packaging layer 900 is formed on the cathode 800 and the third pixel definition layer 330. A touch layer 1000, an optical adhesive layer 1100, a polarizer 1200 and a cover plate 1300 are sequentially formed on the thin film packaging layer 900.

The difference of the second manufacturing method of the first embodiment of the organic light emitting diode panel of the present invention from the first manufacturing method is that: after the first pixel definition layer 310 is formed, the plurality of the first openings 301, correspondingly disposed above the plurality of first anodes 211, is first formed on the first pixel definition layer 310. Then, after forming the second pixel definition layer 320, the plurality of second openings 302, correspondingly disposed above the plurality of second anodes 221, is formed on the second pixel definition layer 320. Meanwhile, a portion of the second pixel definition layer 320 corresponding to the first opening 301 is removed. Then, after forming the third pixel definition layer 330, the plurality of third openings 303, correspondingly disposed above the plurality of third anodes 231, is formed on the third pixel definition layer 330. Meanwhile, a portion of the third pixel definition layer 330 corresponding to the first opening 301 and the second opening 302 is removed, and the rest steps are the same as those of the first manufacturing method. Compared with the first fabricating method, the second fabricating method does not need to make openings with different depths. The process is simple and the reliability is higher.

Significantly, as the second embodiment of the organic light emitting diode panel of the present invention is used in a red, green and blue three color display device, preferably, the organic light emitting diode functional layer 700 located in the plurality of first openings 301 has the same color, the organic light emitting diode functional layer 700 located in the plurality of second openings 302 has the same color, and the organic light emitting diode functional layer 700 located in the plurality of third openings 303 has the same color. Meanwhile, the organic light emitting diode functional layer 700 in the first opening 301, the organic light emitting diode functional layer 700 in the second opening 302, and the organic light emitting diode functional layer 700 in the third opening 303 are one of a red organic light emitting diode functional layer, a green organic light emitting diode functional layer and a blue color, respectively. Namely, the OLED functional layer 700 of the same color is formed on the anodes of the same anode layer, so as to avoid the influence on the monochromatic display effect due to the inconsistency of the process conditions to improve the quality of the product.

Specifically, in the second embodiment of the organic light emitting diode of the present invention, the first anode layer 210 is disposed above the thin film transistor substrate 100, and the second anode layer 220 and the pixel definition layer 300 are disposed on the first anode layer 210, and meanwhile, the third anode layer 230 is disposed on the second pixel definition layer 320 of the pixel definition layer 300, and specifically, a sum of the width of the plurality of the second anode 221 of the second anode layer 220 and the width of the plurality of the third anode 231 of the third anode layer 230 is greater than the width of the corresponding first space 212. Thus, the first anode layer 210, the second anode layer 220 and the third anode layer 230 together shield the thin film transistor substrate 100 to form a compact reflective layer. Thus, as the organic light emitting diode panel displays, the light emitted from the organic light emitting diode functional layer 700 is totally reflected on the compact reflective layer formed by the first anode layer 210, the second anode layer 220 and the third anode layer 230, together. The reflection of the light emitted from the organic light emitting diode functional layer 700 inside the organic light emitting diode panel is greatly enhanced, to enhance the brightness and viewing angle of the organic light emitting diode panel, to reduce the power consumption, and to improve the product quality.

In conclusion, the organic light emitting diode panel of the present invention comprises a thin film transistor substrate, a first anode layer disposed on the thin film transistor substrate and a second anode layer and a pixel definition layer disposed on the first anode layer, wherein the pixel definition layer comprises a first pixel definition layer disposed between the first anode layer and the second anode layer. By disposing the first anode layer and the second anode layer, as the organic light emitting diode panel displays, the reflection of the light emitted from the organic light emitting diode functional layer inside the organic light emitting diode panel is greatly enhanced, to enhance the brightness and viewing angle of the organic light emitting diode panel, to reduce the power consumption, and to improve the product quality.

Above are only specific embodiments of the present invention, the scope of the present invention is not limited to this, and to any persons who are skilled in the art, change or replacement which is easily derived should be covered by the protected scope of the invention. Thus, the protected scope of the invention should go by the subject claims.

What is claimed is:

1. An organic light emitting diode panel, comprising a thin film transistor substrate, a first anode layer disposed on the thin film transistor substrate and a second anode layer and a pixel definition layer disposed on the first anode layer, wherein the pixel definition layer comprises a first pixel definition layer disposed between the first anode layer and the second anode layer, wherein the pixel definition layer further comprises a second pixel definition layer disposed on the second anode layer, and wherein the first anode layer comprises a plurality of first anodes; the second anode layer comprises a plurality of second anodes; a first space is formed between two adjacent first anodes, and the second anode is correspondingly disposed above the first space.

2. The organic light emitting diode panel according to claim 1, wherein the first pixel definition layer and the second pixel definition layer have the same material.

3. The organic light emitting diode panel according to claim 1, wherein a width of the second anode is greater than a width of the first space.

4. The organic light emitting diode panel according to claim 1, wherein a plurality of first openings is disposed on the plurality of first anodes, and a plurality of second openings is disposed on the plurality of second anodes, and an organic light emitting diode functional layer is provided in the first opening and in the second opening.

5. The organic light emitting diode panel according to claim 1, further comprising a planarization layer disposed between the first anode layer and the thin film transistor substrate, and the first anode and the second anode are electrically connected to the thin film transistor substrate by penetrating through the planarization layer.

6. The organic light emitting diode panel according to claim 4, further comprising a third anode layer disposed on the second pixel definition layer.

7. The organic light emitting diode panel according to claim 6, wherein the pixel definition layer further comprises a third pixel definition layer disposed on the third anode layer;
the first pixel definition layer, the second pixel definition layer and the third pixel definition layer have the same material.

8. The organic light emitting diode panel according to claim 7, wherein the third anode layer comprises a plurality of third anodes; the third anode is correspondingly disposed above the first space, and both a width of the second anode and a width of the third anode are less than a width of the first space, and a sum of the width of the second anode and the width of the third anode is greater than the width of the first space;
a plurality of third openings is disposed on the plurality of third anodes, and the organic light emitting diode functional layer is provided in the third opening.

* * * * *